(12) United States Patent
Noguchi et al.

(10) Patent No.: US 9,980,379 B2
(45) Date of Patent: May 22, 2018

(54) OPTICAL MODULE

(71) Applicant: Oclaro Japan, Inc., Kanagawa (JP)

(72) Inventors: Daisuke Noguchi, Sagamihara (JP); Hiroshi Yamamoto, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days. days.

(21) Appl. No.: 15/247,970

(22) Filed: Aug. 26, 2016

(65) Prior Publication Data

US 2017/0064831 A1    Mar. 2, 2017

(30) Foreign Application Priority Data

Aug. 31, 2015  (JP) ................. 2015-171355

(51) Int. Cl.
| | |
|---|---|
| *H05K 7/00* | (2006.01) |
| *H05K 1/11* | (2006.01) |
| *H05K 1/14* | (2006.01) |
| *H05K 1/02* | (2006.01) |
| *G02B 6/42* | (2006.01) |

(52) U.S. Cl.
CPC ............ *H05K 1/117* (2013.01); *H05K 1/025* (2013.01); *G02B 6/4279* (2013.01); *H05K 1/0245* (2013.01); *H05K 1/141* (2013.01); *H05K 2201/09381* (2013.01); *H05K 2201/1034* (2013.01); *H05K 2201/10121* (2013.01); *H05K 2203/049* (2013.01)

(58) Field of Classification Search
CPC ...... H05K 1/0245; H05K 1/141; H05K 1/117; H05K 1/025; H05K 2201/09381; H05K 2201/10121; H05K 2201/1034; H05K 2201/049; G02B 6/4279
USPC ................................ 361/728–730
See application file for complete search history.

(56) References Cited

U.S. PATENT DOCUMENTS

| | | | |
|---|---|---|---|
| 2004/0126066 A1* | 7/2004 | Keh ..................... | G02B 6/4201 385/92 |
| 2004/0208211 A1* | 10/2004 | Maruyama .......... | H01S 5/02212 372/38.1 |
| 2012/0267738 A1* | 10/2012 | Kuwahara ........... | H01L 31/0203 257/431 |

(Continued)

FOREIGN PATENT DOCUMENTS

| | | |
|---|---|---|
| JP | 2005-191088 A | 7/2005 |
| JP | 2012-227486 A | 11/2012 |
| JP | 2013-004787 A | 1/2013 |

*Primary Examiner* — Hung S Bui
(74) *Attorney, Agent, or Firm* — Mattingly & Malur, PC (57) ABSTRACT

The second wiring pattern includes extended regions from the main body side to the projecting portions as seen in a direction in which the pair of leads extend, and wiring regions continuously spreading from the extended regions in a direction away from the main body. Supposing that a length of the wiring region from an end of the projecting portion as a reference point to a farthest position in a direction away from the main body is a first width and a width of the extended region in a direction parallel to a side opposed to the main body side through the end of the projecting portion is a second width, the first width is smaller than the second width. The second insulating substrate is sandwiched between the second wiring pattern and a base, and thereby, a capacitance is formed.

6 Claims, 6 Drawing Sheets

(56) References Cited

U.S. PATENT DOCUMENTS

2015/0116809 A1* 4/2015 Uto .................... H01S 5/02208
359/245

* cited by examiner

OPTICAL MODULE

CROSS-REFERENCE TO RELATED APPLICATION

The present application claims priority from Japanese application JP2015-171355 filed on Aug. 31, 2015, the content of which is hereby incorporated by reference into this application.

BACKGROUND OF THE INVENTION

1. Field of the Invention

This invention relates to an optical module.

2. Description of the Related Art

JP 2013-004787 A discloses an optical module including a stem formed using a conducting material and connected to the ground, a lead terminal penetrating the stem and attached to the stem and electrically insulated from the stem via an insulating material in a part penetrating the stem, and a photonic device mounted on a stem mount as a part of the stem and electrically connected to the lead terminal, wherein a dielectric substrate having a front surface opposed to the lead terminal and a rear surface electrically connected to the stem mount.

JP 2005-191088 A discloses a package for semiconductor having a high-frequency transmission line penetrating a package casing for transmitting a high-frequency signal from outside to inside, the high-frequency transmission line including a first transmission line part provided in a partition wall part from outside of the package and having a lower characteristic impedance than a characteristic impedance to be matched when transmitting the high-frequency signal from outside to inside, a second transmission line part provided outside of the package, electrically connected to the first transmission line part, and having a higher characteristic impedance than the first transmission line part, and a third transmission line part provided inside of the package, electrically connected to the first transmission line part, and having a higher characteristic impedance than the first transmission line part.

JP 2012-227486 A discloses an optical device including a mounting part having a stem, an upper surface, a lower surface, a first surface and a second surface corresponding to side surfaces with respect to the upper surface and the lower surface, the lower surface connected to the stem, a photonic device mounted on the upper surface of the mounting part, electronic components respectively mounted on the first surface and the second surface of the mounting part, and a plurality of first leads penetrating the stem and led out to the first surface side and the second surface side of the mounting part, and electrically connected to the electronic components.

Today, most of the Internet and telephone networks are constructed by optical communication networks. Optical modules used as routers/switches as optical communication devices and interfaces of transmission apparatuses have important roles of converting electrical signals into optical signals.

Downsizing is required for the optical module itself and, for realization of further speeding up, mounting having higher reliability is required for the optical module.

For example, as an optical module that fulfills the above described requirements, e.g. a CAN package optical module or the like having a form in which lead terminals to be inserted into a printed board or the like from a metal stem contained in a box-shaped can package protrude is known.

The optical module includes a photonic device for converting one of an optical signal and an electrical signal into the other. Here, for the electrical signal, e.g. a differential signal including a normal phase signal and a reverse phase signal may be used. In this case, there is a problem in realization of impedance matching in a transmission line.

Placement of several relay boards in a transmission line for the electrical signal to reach the photonic device is not avoidable, inductance components are parasitic in connecting parts to the relay boards, and consequently, impedance mismatch is caused.

Therefore, for realization of impedance matching, it is necessary to compensate for the inductance components generated in the connecting parts by capacitances. For example, compensation by incorporation of a chip capacitor in the transmission line of the relay board is considered, however, adverse effects of upsizing of the relay boards and cost increase for placement of chip capacitor are caused.

SUMMARY OF THE INVENTION

An object of the invention is to provide a compact optical module including a photonic device etc. and realizing impedance matching while efficiently compensating for inductance components parasitic on a transmission line for an electrical signal to reach the photonic device by capacitances.

Further, the above described and other objects and new features of the invention will be made clear by the description of the specification and the accompanying drawings.

An optical module according to an embodiment of the invention includes a photonic device for converting one of an optical signal and an electrical signal into the other, a pair of leads for transmitting the electrical signal, a first relay board having a first insulating substrate and a first wiring pattern provided on the first insulating substrate, on which the photonic device is mounted to be electrically connected to the first wiring pattern, a second relay board having a second insulating substrate and a second wiring pattern provided on the second insulating substrate, the pair of leads electrically connected to the second wiring pattern, a plurality of wires that electrically connect the first wiring pattern and the second wiring pattern, and a conducting stem having a main body electrically insulated and penetrated by the pair of leads, and a base protruding from the main body in a penetration direction of the pair of leads, the base supporting the first relay board and the second relay board, wherein the first relay board is mounted on the base in a position apart from the main body so that the first wiring pattern may be insulated by the first insulating substrate, the second relay board is mounted on the base adjacently to the main body between the main body and the first relay board so that the second wiring pattern may be insulated by the second insulating substrate, each of the pair of leads has a projecting portion projecting above the second wiring pattern from the main body, the second wiring pattern includes extended regions from the main body side to the projecting portions as seen in a direction in which the pair of leads extend, and wiring regions continuously spreading from the extended regions in a direction away from the main body, supposing that a length of the wiring region from an end of the projecting portion as a reference point to a farthest position in a direction away from the main body is a first width and a width of the extended region in a direction parallel to a side opposed to the main body side through the end of the projecting portion is a second width, the first width is smaller than the second width, and the second insulating substrate is sandwiched between the second wiring pattern and the base, and thereby, a capacitance is formed.

In the optical module according to the embodiment of the invention, each one of the extended regions corresponding to the pair of leads may spread in a direction closer to the extended region corresponding to the other of the pair of leads.

In the optical module according to the embodiment of the invention, the projecting portion and the second wiring pattern overlapping with each other may be brazed or soldered.

In the optical module according to the embodiment of the invention, the electrical signal may be a differential signal including a normal phase signal and a reverse phase signal, the pair of leads may be arranged in parallel to form a differential transmission line, the plurality of wires may include a first wire electrically connected to one of the pair of leads and a second wire electrically connected to the other of the pair of leads, and the first wire and the second wire may be arranged in parallel to form the differential transmission line.

In the optical module according to the embodiment of the invention, the first relay board and the second relay board may respectively have widths in a direction orthogonal to a direction in which the boards are arranged with respect to each other, and the plurality of wires may be provided only in a region between the pair of leads in the width direction.

In the optical module according to the embodiment of the invention, the width of the second relay board may be larger than the width of the first relay board.

DETAILED DESCRIPTION OF THE INVENTION

First Embodiment

First, an overview of an optical module according to the first embodiment of the invention will be explained with reference to FIGS. 1 to 4.

Figure 1:
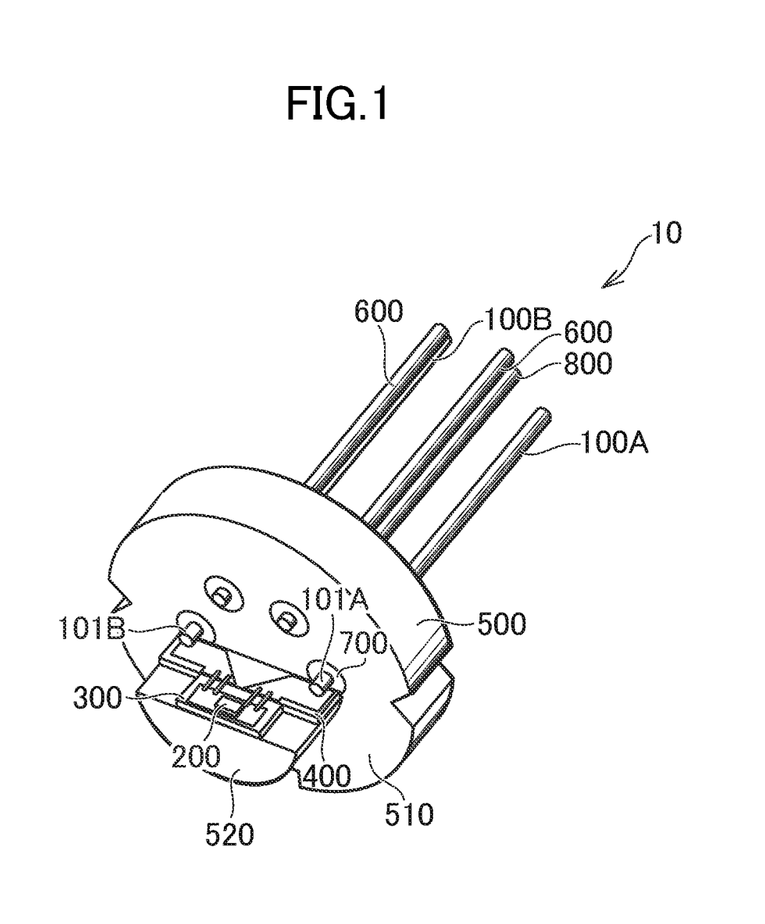
FIG. 1 is a perspective view of an optical module according to a first embodiment of the invention.
Figure 2:
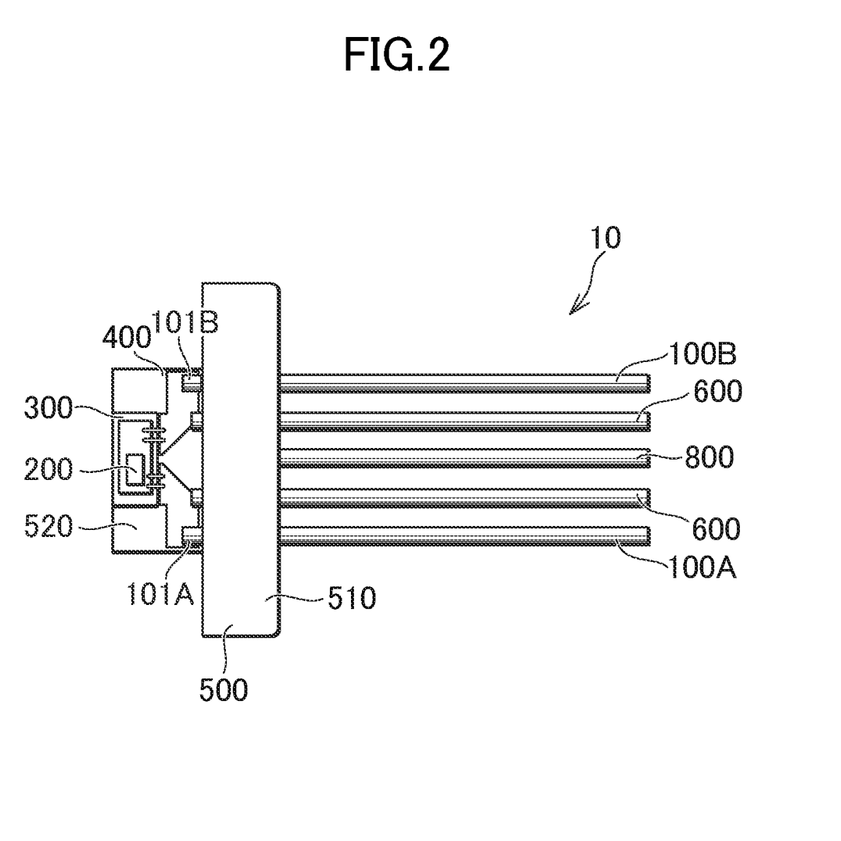
FIG. 2 is a plan view of the optical module according to the first embodiment of the invention.
Figure 3:
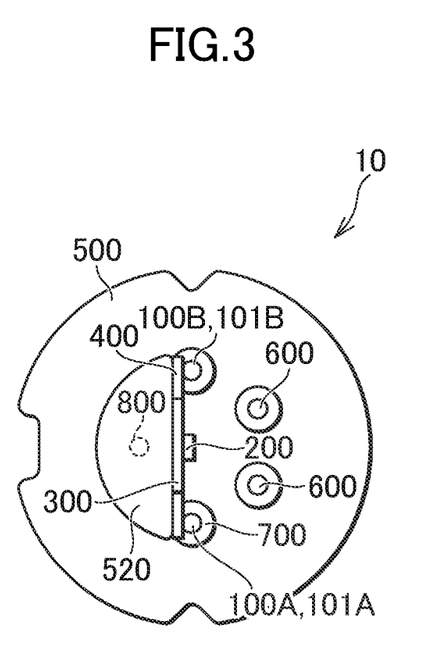
FIG. 3 is a front view of the optical module according to the first embodiment of the invention.
Figure 4:
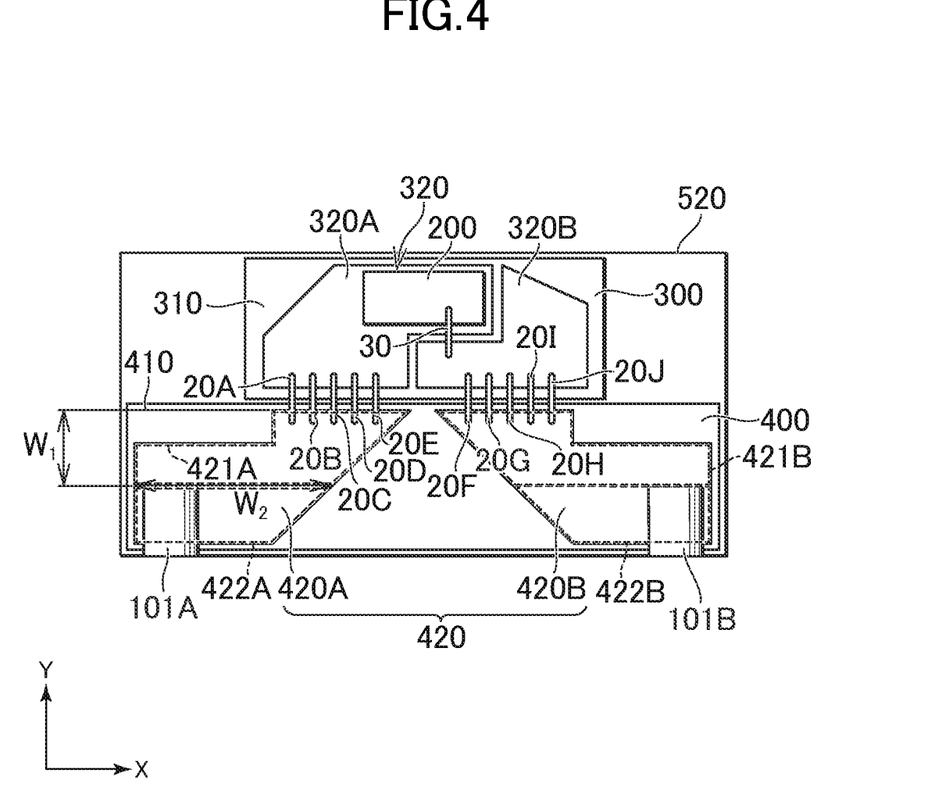
FIG. 4 is an enlarged plan view showing a state with a first relay board and a second relay board forming a part of the optical module according to the first embodiment of the invention.

FIG. 1 is a perspective view of the optical module according to the first embodiment of the invention. FIG. 2 is a plan view of the optical module according to the first embodiment of the invention. FIG. 3 is a front view of the optical module according to the first embodiment of the invention. FIG. 4 is an enlarged plan view showing a state with a first relay board and a second relay board forming a part of the optical module according to the first embodiment of the invention.

As shown in FIG. 1, an optical module 10 according to the first embodiment may be adapted to e.g. a CAN package TOSA (Transmitter Optical Sub-Assembly). The following explanation will be based on an example in which the optical module 10 according to the first embodiment is adapted to the CAN package TOSA.

The optical module 10 according to the first embodiment includes a photonic device 200 for converting electrical signals into optical signals, a pair of leads 100A, 100B for transmitting the electrical signals, a first relay board 300 having a first insulating substrate 310 and first wiring patterns 320 provided on the first insulating substrate 310, on which the photonic device 200 is mounted to be electrically connected to the first wiring patterns 320, a second relay board 400 having a second insulating substrate 410 and second wiring patterns 420 provided on the second insulating substrate 410, the pair of leads 100A, 100B electrically connected to the second wiring patterns 420, a plurality of wires 20 that electrically connect the first wiring patterns 320 and the second wiring patterns 420, and a conducting stem 500 having a main body 510 electrically insulated and penetrated by the pair of leads 100, and a base 520 protruding from the main body 510 in a penetration direction of the pair of leads 100, the base 520 supporting the first relay board 300 and the second relay board 400.

Further, the first relay board 300 is mounted on the base 520 in a position apart from the main body 510 so that the first wiring patterns 320 may be insulated by the first insulating substrate 310. Similarly, the second relay board 400 is mounted on the base 520 adjacently to the main body 510 between the main body 510 and the first relay board 300 so that the second wiring patterns 420 may be insulated by the second insulating substrate 410.

Furthermore, each of the pair of leads 100 has a projecting portion 101 projecting above the second wiring patterns 420 from the main body 510. The second wiring patterns 420 include extended regions 422 containing regions overlapping with the respective projecting portions 101 of the pair of leads 100 and wiring regions 421 of other parts continuously connected from the extended regions 422. The details of the extended regions 422 will be described later. The second relay board forms a capacitance by sandwiching the second insulating substrate 410 by the second wiring patterns 420 and the base 520.

As below, the configuration of the optical module 10 according to the first embodiment will be explained.

The photonic device 200 included in the optical module 10 according to the first embodiment may be realized by e.g. a semiconductor laser. The photonic device 200 converts the electrical signal input via the first relay board 300 and the second relay board 400 into the optical signal and outputs the signal.

The optical signal output from the photonic device 200 is monitored by a monitor PD (not shown). Leads shown by signs 600 in the drawings are leads for connection to the monitor PD.

The optical module 10 monitors light output from the photonic device 200 by the monitor PD, and controls light intensity output from the photonic device 200 to be constant by a control IC (not shown) connected to the optical module 10, for example, based on the monitoring result.

Further, the above described electrical signal is a differential signal including a normal phase signal and a reverse phase signal, and the pair of leads 100A, 100B are arranged in parallel to form a part of a differential transmission line.

The pair of leads 100A, 100B have projecting portions 101A, 101B that penetrate the main body 510 of the stem 500 formed by a conductor such as a metal, for example, and projecting from the main body 510 of the stem 500 in the penetration direction.

Note that, in parts in which the pair of leads 100A, 100B penetrate the main body 510 of the stem 500, insulating materials 700 such as insulating glass, for example, are provided around the pair of leads 100A, 100B, and the pair of leads 100A, 100B and the stem 500 are insulated from each other.

In the respective positions in which the projecting portions 101A, 101B project from the main body 510 of the stem 500, the base 520 protruding from the main body 510 of the stem 500 and supporting the first relay board 300 and the second relay board 400, which will be described in detail, is provided.

Note that the base 520 has conductivity like the main body 510 of the stem 500 and may be integrally formed with the main body 510 of the stem 500.

Further, a ground lead 800 electrically connected to the main body 510 of the stem is provided and the ground lead 800 is connected to the main body 510 on the back side of the base 520. Here, the ground lead 800 is used as a ground (GND) terminal.

The second relay board 400 has the second insulating substrate 410 and second wiring patterns 420A, 420B provided on the second insulating substrate 410, and the pair of leads 100A, 100B (projecting portions 101A, 101B) are electrically connected to the second wiring patterns 420A, 420B. That is, the pair of projecting portions 101A, 101B corresponding to the pair of leads 100A, 100B, respectively, are connected to the second wiring patterns 420A, 420B of the second relay board 400 supported on the base 520, respectively.

The second insulating substrate 410 may be formed using a dielectric material.

As shown in FIG. 4, the second relay board 400 includes the second wiring patterns 420A, 420B formed by two conducting films apart from each other in the positions in which the pair of projecting portions 101A, 101B are provided on one second insulating substrate 410.

The second relay board 400 has a nearly rectangular shape and, in FIG. 4, a direction along the long side of the second relay board is an X-axis and a direction along the short side is a Y-axis. The projecting portions 101A, 101B of the pair of leads are arranged to be substantially perpendicular to the long side of the second relay board 400, though there may be some minor deviations depending on mounting accuracy. Here, the details of the second wiring patterns 420 are described. The second wiring pattern 420 includes the extended region 422 and the wiring region 421. As seen in the Y-axis direction, the extended region 422 is a region from the lower side of the second wiring pattern 420 to the end of the projecting portion 101, and the wiring region 421 is a region from the end of the projecting portion to the upper side of the second wiring pattern 420. The extended region 422 and the wiring region 421 are a continuous wiring pattern, though divided for convenience of explanation.

Here, in the parts in which the projecting portions 101A, 101B and the second wiring patterns 420A, 420B are connected, inductance components are parasitic and impedance mismatching is caused. Accordingly, to realize impedance matching, it is necessary to compensate for the inductance components generated in the connecting parts by capacitances.

The optical module 10 according to the first embodiment compensates for the above described inductance components by the capacitance formed by the second insulating substrate 410 sandwiched between the second wiring patterns 420A, 420B and the base 520.

Now, a physically slight gap exists between the second relay board 400 and the main body 510 of the stem 500. A slight air gap exists between the projecting portions 101A, 101B and the base 520, and thus, to compensate for the inductance components, it is necessary to form a larger capacitance.

In the optical module 10 according to the first embodiment, to realize formation of the larger capacitance, areas of the second wiring patterns 420A, 420B of the second relay board 400 are provided to be larger.

More specifically, the extended region 422 has not only a region overlapping with the projecting portion 101, but a shape spreading in the X-axis direction. Here, a width of the extended region 422 through the end of the projecting portion 101 as seen in the X-axis direction is defined as a second width W2. To obtain the larger capacitance, it is desired that the second width W2 is larger. To increase the second width W2, in the embodiment, as shown in FIG. 4, the extended regions 422A, 422B spread in the region surrounded by the projecting portion 101A and the projecting portion 101B. Originally, there is a certain gap between the projecting portion 101A and the projecting portion 101B, and the larger capacitance may be formed by effectively using the region. Here, the capacitance becomes larger by increasing the length of the projecting portion, that is, increasing the width of the extended region 422 in the Y-axis direction. However, it is not preferable to increase the projecting portion because the increase leads to entire upsizing in the Y-axis direction.

Next, the wiring region 421 is described. The wiring region 421 is provided for distributing wires when connected to the first wiring pattern 320 by the wires. The part of the wiring region 421 forms a capacitance between the base 520 and itself. However, the capacitance in this region contributes less to the compensation of the inductance components generated around the connecting part to the projecting portion 101, and may simply cause production of a new capacitance component in the transmission line. Accordingly, it is preferable that the wiring region 421 is smaller.

However, a certain region for distributing the wires 20 is necessary. If a thinner pattern than the pattern shown in FIG. 4 is provided between the region for distributing the wires 20 and the extended region 422, the thinner pattern is preferable in view of reduction of the parasitic capacitance, however, the wiring width is frequently changed. The part in which the wiring width is changed may be a reflection point of the electrical signal.

Therefore, a wiring pattern with as less corners as possible is preferable. In the embodiment, slanted patterns or the like are incorporated in view of that. Further, in addition to the pattern with less corners, it is preferable to decrease the wiring region in the Y-axis direction to decrease the wiring region 421.

Here, the maximum length of the length of the wiring region 421 from the end of the projecting portion 101 as a reference point in the Y-axis direction is defined as a first width W1. As the first width W1 is smaller, the capacitor component (parasitic capacitance) that contributes less to the compensation of the inductance components around the connecting part of the projecting portion 101 may be made smaller. Note that the expression of "contribute less" is used because the electric field of the electrical signal has a breadth and it is impossible to clarify the boundary of the region of the capacitor component that contributes to the compensation of the inductance components. In any case, as the capacitor component is farther from the lead, the contribution to the compensation of the inductance components is smaller.

In the embodiment, the first width W1 is set to be smaller than the second width W2. As seen in the Y-axis direction, the region larger than the second width W2 is a region with a disadvantage as a parasitic capacitance more apparent than the compensation of the inductance components around the connecting part of the projecting portion 101. Further, that leads to upsizing of the second relay board.

Note that, as shown in FIG. 4, the second wiring pattern 420 has the following shape in other words. The second wiring pattern 420 is a region on the side away from the main body 510, and includes the extended region 422 located at the distance from the main body 510 to the end of the projecting portion 101 and the wiring region 421 continuously spreading from the extended region 422 to the side away from the main body 510. Further, in a direction parallel to the side of the extended region 422 opposed to the main body 510, the second width W2 as the width through the end of the projecting portion 101 is larger than the first width W1 as the maximum width in a direction perpendicular to the side of the wiring region 421, the second insulating substrate 410 is sandwiched between the second wiring pattern 420 and the base 520, and thereby, the capacitance is formed.

Note that the wiring region 421 may be little and the wires 20 can be distributed in the extended region 422. In this case, the parasitic capacitance is smaller and the case is preferable in view of downsizing of the second relay board. In the embodiment, the wiring region 421 is provided because a brazing filler material used for connection between the projecting portion 101 and the second wiring pattern 420 may wet-spread to the region of the extended region 422 in which the wires 20 are distributed.

The optical module 10 includes the second wiring patterns 420A, 420B having the above described shapes, and thereby, the larger capacitance may be formed and both impedance matching and downsizing may be realized.

Further, in the optical module 10 according to the first embodiment, the projecting portion of the lead 101 and the second wiring pattern 420 overlapping with each other may be brazed or soldered.

The first relay board 300 has the first insulating substrate 310 and the first wiring patterns 320 provided on the first insulating substrate 310, and placed on the base 520 to sandwich the second relay board 400 between the main body 510 of the stem 500 and itself.

The first insulating substrate 310 may be formed using a dielectric material.

As shown in FIGS. 1 to 4, on the base 520, the main body 510 of the stem 500, the second relay board 400, and the first relay board 300 are sequentially arranged in the extension direction of the leads 100A, 100B. The optical signal output from the photonic device 200 is output along the extension direction of the leads 100A, 100B in a direction away from the first relay board 300.

The first wiring patterns 320 in the optical module 10 according to the first embodiment include two conducting films 320A, 320B provided apart from each other as shown in FIG. 4. Further, the photonic device 200 is placed on one conducting film 320A of the two conducting films, and the photonic device 200 and the other conducting film 320B are electrically connected by wires 30.

Here, the position on which the photonic device 200 is mounted determines the position from which light is output from the optical module 10, and thus, it is important to place the photonic device 200 in an appropriate position in the optical module 10.

Now, the photonic device 200 is very small, and it is difficult in the manufacturing process to directly mount the photonic device 200 while positioning the device in a proper position on the first wiring patterns 320 in a state in which the first relay board 300 is provided on the base 520 of the stem 500. Accordingly, it is preferable to employ a manufacturing process of mounting the photonic device 200 on the first wiring patterns 320 of the first relay board 300 in advance, and then, attaching the first relay board 300 on which the photonic device 200 is mounted to the base 520 so that the photonic device 200 may be placed in an appropriate position.

There is no other relay board or the like placed in a direction orthogonal to the direction of the light output from the photonic device 200 of the first relay board 300, and thus, positioning in the direction orthogonal to the direction of the light output from the photonic device 200 of the first relay board 300 may be easily performed.

Further, there is no other relay board or the like placed on the opposite side to the adjacent side to the second relay board 400 in a direction of the light output from the photonic device 200 of the first relay board 300, and thus, positioning in the direction of the light output from the photonic device 200 of the first relay board 300 may be easily performed.

Therefore, in the optical module 10 according to the first embodiment, positioning of the photonic device 200 may be accurately performed and, as a result, reliability of the optical module 10 may be improved.

The first relay board 300 and the second relay board 400 respectively have the widths in the direction orthogonal to the direction in which the boards are arranged, and the width of the second relay board 400 may be larger than the width of the first relay board 300.

As described above, the widths of the first relay board 300 and the second relay board 400 are set, and thereby, at positioning of the first relay board 300, the first relay board 300 is movable in a range with room and positioning may be easily performed. Further, that leads to downsizing of the first relay board, and an advantage of cost reduction may be obtained.

The main body 510 of the stem 500, the second relay board 400, and the first relay board 300 are sequentially arranged in the extension direction of the leads 100A, 100B, and thereby, the wires that electrically connect the first relay board 300 and the second relay board 400 may be placed along the extension direction of the leads 100A, 100B, the wires that transmit the respective normal phase and reverse phase electrical signals can be electrically coupled to each other, and inductances parasitic in the wires may be relaxed.

As shown in FIG. 4, the plurality of wires 20 (wires with signs 20A to 20J in the drawing, hereinafter, referred to as "first group of wires") that electrically connect the first wiring patterns 320 and the second wiring patterns 420 are placed along the extension direction of the leads 100A, 100B.

For example, the first group of wires 20 forming a part of the optical module 10 according to the first embodiment may include two groups of wires that respectively transmit the normal phase and the reverse phase of the differential signal.

The two groups of wires here in the optical module 10 according to the first embodiment refer to a group of wires with the signs 20A to 20E and a group of wires with the signs 20F to 20J in FIG. 4.

These two groups of wires may be arranged in parallel to each other.

The first group of wires forming the part of the optical module 10 according to the first embodiment may include at least four wires for reduction of inductances of the respective wires. Note that, in FIG. 4, the first relay board 300 including ten wires is shown.

Further, of the above described two groups of wires forming the first group of wires 20, a distance between the wires placed on the sides of the groups closest to each other may be 1 mm or less. More specifically, in FIG. 4, the distance between the wire 20E and the wire 20F may be 1 mm or less.

As described above, the distance between the wire 20E and the wire 20F is set to 1 mm or less, and thereby, downsizing of the optical module 10 is realized.

The first relay board 300 and the second relay board 400 respectively have the widths in the direction orthogonal to the direction in which the boards are arranged, and, in the width direction, all of the wires 20A to 20J forming the first group of wires 20 may be provided only in a region between the pair of leads 100A, 100B.

As described above, all of the wires 20A to 20J forming the first group of wires 20 are provided, and thereby, downsizing of the optical module 10 is realized.

Second Embodiment

Next, an overview of an optical module according to the second embodiment of the invention will be explained with reference to FIG. 5. The optical module according to the second embodiment is different from the optical module 10 according to the first embodiment in shape of the first wiring pattern 320. Further, the shape of the first wiring pattern 320 is different, and thereby, placement of wires that electrically connect the first wiring pattern 320 and the second wiring patterns 420 is different. The rest of the configuration of the optical module according to the second embodiment is the same as that of the optical module 10 according to the first embodiment, and the explanation will be omitted.

Figure 5:
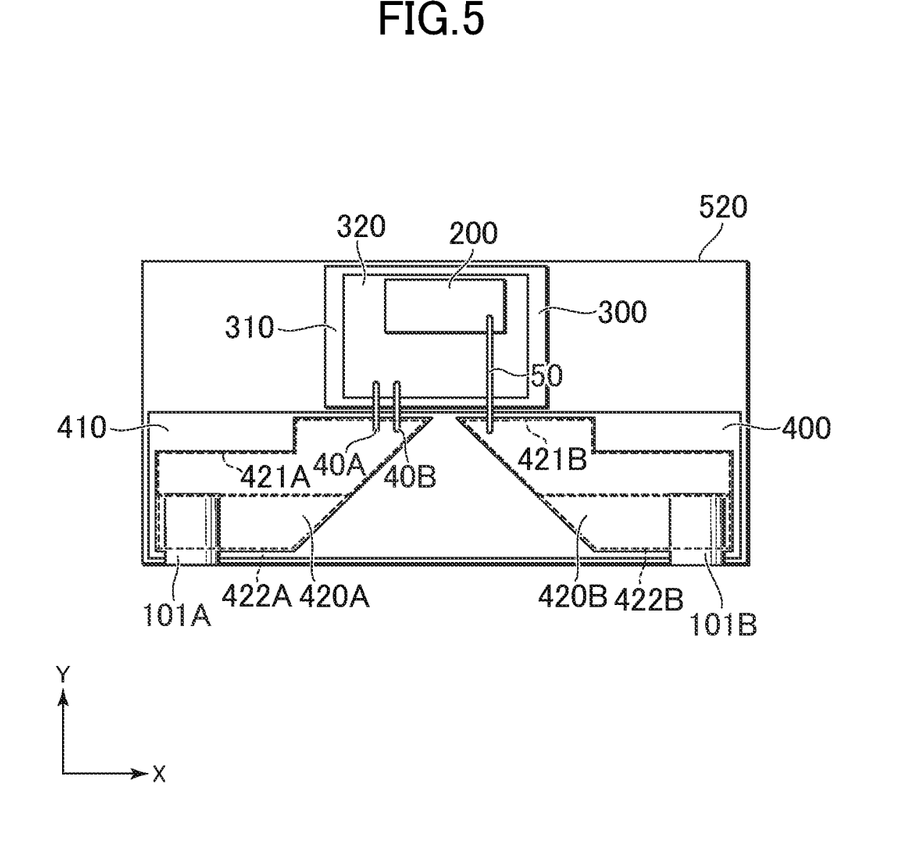
FIG. 5 is an enlarged plan view showing a state with a first relay board and a second relay board forming a part of an optical module according to a second embodiment of the invention.

FIG. 5 is an enlarged plan view showing a state with a first relay board and a second relay board forming a part of the optical module according to the second embodiment of the invention.

As shown in FIG. 5, a first relay board 300 forming the part of the optical module according to the second embodiment has a first insulating substrate 310 and a first wiring pattern 320 including one conducting film provided on the first insulating substrate 310, and is placed on a base 520 to sandwich a second relay board 400 between a main body 510 of a stem 500 and itself.

A first group of wires as a plurality of wires that electrically connect the first wiring pattern 320 and second wiring patterns 420 in the optical module according to the second embodiment correspond to signs 40A, 40B in the drawing.

In the optical module according to the second embodiment, the respective plurality of wires forming a first group of wires 40 are placed along an extension direction of leads 100A, 100B.

The wires that electrically connect a photonic device 200 are directly connected to a second wiring pattern 420B.

The first relay board 300 having the first wiring pattern 320 as shown in FIG. 5 is used, and thereby, the manufacturing steps may be simplified and, as a result, an advantage that the manufacturing process may be simplified is exerted.

Third Embodiment

Next, an overview of an optical module according to the third embodiment of the invention will be explained with reference to FIG. 6. The optical module according to the third embodiment is different from the optical module 10 according to the first embodiment in shapes of the second wiring patterns 420. The rest of the configuration of the optical module according to the third embodiment is the same as that of the optical module 10 according to the first embodiment, and the explanation will be omitted.

Figure 6:
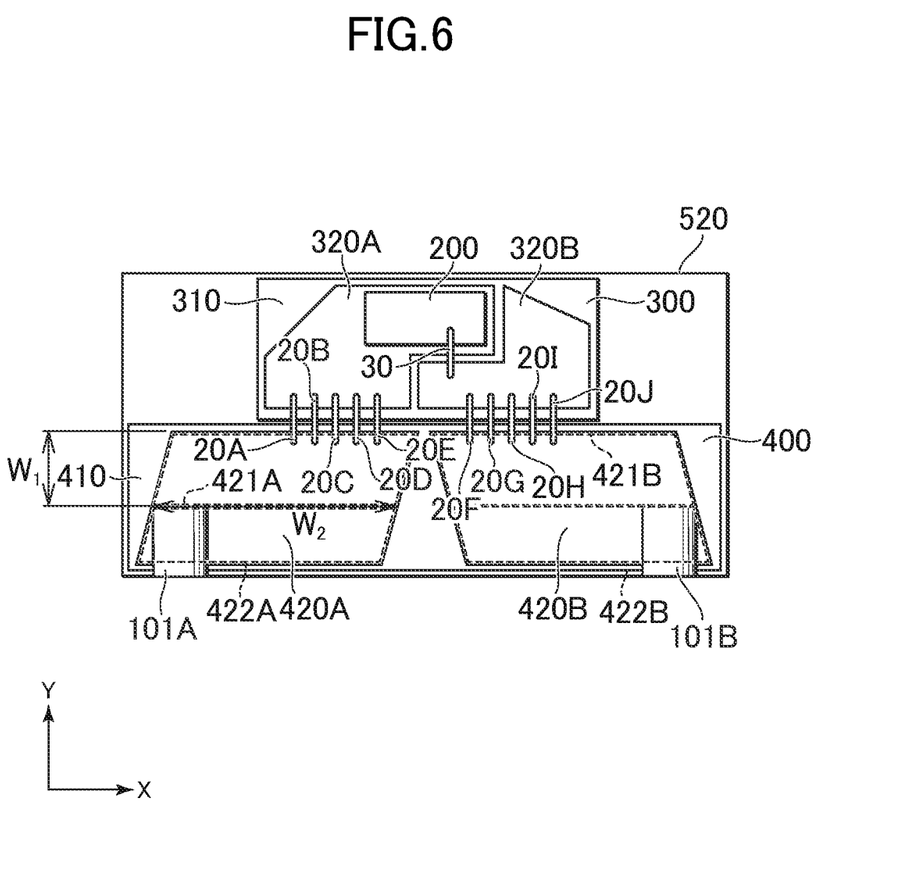
FIG. 6 is an enlarged plan view showing a state with a first relay board and a second relay board forming a part of an optical module according to a third embodiment of the invention.

FIG. 6 is an enlarged plan view showing a state with a first relay board and a second relay board forming a part of the optical module according to the third embodiment of the invention.

Like the second wiring patterns 420 of the optical module according to the first embodiment, second wiring patterns 420 of the optical module according to the third embodiment include second wiring patterns 420A, 420B formed by two conducting films apart from each other in positions in which a pair of projecting portions 101A, 101B are provided on one second insulating substrate 410.

However, the conducting films 420A, 420B in the second wiring patterns 420 provided in the optical module according to the third embodiment form a parallelogram with a bottom side in the X-axis direction. That is, all lengths of the widths in the X-axis direction are the same as the length of the second width W2.

Mounting of the first relay board 300 in a position shifted in the direction orthogonal to the leads 100A, 100B may occur for positioning of the photonic device 200 to be mounted. For example, in the case where the first relay board 300 is largely shifted, if the widths of the conducting films 420A, 420B of the second wiring patterns 420 spreading toward the first relay board side are smaller, it may be impossible to secure the space for bonding of the wires 20.

In the optical module according to the third embodiment, the widths of the conducting films 420A, 420B of the second wiring patterns 420 spreading toward the first relay board side are larger, and thereby, the above described problem of the space for bonding of the wires 20 may be resolved.

As a result, the second relay board 400 having the second wiring patterns 420 as shown in FIG. 6 is used, and thereby, reliability of wire bonding between the first relay board 300 and the second relay board 400 may be improved.

In the above described embodiments, the optical module is explained by taking the TOSA having a transmitting function as an example, however, the same advantages may be obtained in a ROSA (Receiver Optical Sub-Assembly) having a receiving function.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
  a photonic device for converting one of an optical signal and an electrical signal into the other;
  a pair of leads for transmitting the electrical signal;
  a first relay board having a first insulating substrate and a first wiring pattern provided on the first insulating substrate, on which the photonic device is mounted to be electrically connected to the first wiring pattern, the first wiring pattern including a first section and a second section;

a second relay board having a second insulating substrate and a second wiring pattern provided on the second insulating substrate, the pair of leads electrically connected to the second wiring pattern, the second wiring pattern including a third section and a fourth section;

a plurality of first wires that electrically connect the first section and the third section, directly;

a plurality of second wires that electrically connect the second section and the fourth section, directly; and a conducting stem having a main body electrically insulated and penetrated by the pair of leads, and a base protruding from the main body in a penetration direction of the pair of leads, the base supporting the first relay board and the second relay board, wherein the first relay board is mounted on the base in a position apart from the main body so that the first wiring pattern may be insulated by the first insulating substrate, the second relay board is mounted on the base adjacently to the main body between the main body and the first relay board so that the second wiring pattern may be insulated by the second insulating substrate, each of the pair of leads has a projecting portion projecting above the second wiring pattern from the main body, the second wiring pattern includes extended regions from the main body side to the projecting portions as seen in a direction in which the pair of leads extend, and wiring regions continuously spreading from the extended regions in a direction away from the main body, each of the extended regions overlaps with a corresponding one of the projecting portions, none of the wiring regions overlaps with any one of the projecting portions, supposing that a length of the wiring region from an end of the projecting portion as a reference point to a farthest position in a direction away from the main body is a first width and a width of the extended region in a direction parallel to a side opposed to the main body side through the end of the projecting portion is a second width, the first width is smaller than the second width, and the second insulating substrate is sandwiched between the second wiring pattern and the base, and thereby, a capacitance is formed.

2. The optical module according to claim 1, wherein each one of the extended regions corresponding to the pair of leads spreads in a direction closer to the extended region corresponding to the other of the pair of leads.

3. The optical module according to claim 1, wherein the projecting portion and the second wiring pattern overlapping with each other are brazed or soldered.

4. The optical module according to claim 1, wherein the electrical signal is a differential signal including a normal phase signal and a reverse phase signal, the pair of leads are arranged in parallel to form a differential transmission line, the plurality of first wires are electrically connected to one of the pair of leads, and the plurality of second wires are electrically connected to the other of the pair of leads, and the first wires and the second wires are arranged in parallel to form the differential transmission line.

5. The optical module according to claim 1, wherein the first relay board and the second relay board respectively have widths in a direction orthogonal to a direction in which the boards are arranged with respect to each other, and the plurality of first wires and the plurality of second wires are provided only in a region between the pair of leads in the width direction.

6. The optical module according to claim 5, wherein the width of the second relay board is larger than the width of the first relay board.

* * * * *